(12) United States Patent
Wu

(10) Patent No.: US 6,899,165 B1
(45) Date of Patent: May 31, 2005

(54) STRUCTURE OF A HEAT-PIPE COOLER

(75) Inventor: Chen-Lung Wu, Tainan (TW)

(73) Assignee: Hua Yin Electric Co., Ltd., Tainan (TW)

( * ) Notice: Subject to any disclaimer, the term of this patent is extended or adjusted under 35 U.S.C. 154(b) by 62 days.

(21) Appl. No.: 10/866,737

(22) Filed: Jun. 15, 2004

(51) Int. Cl.[7] ............................................. F28D 15/00
(52) U.S. Cl. ........................... 165/104.26; 165/104.21; 361/700; 257/715
(58) Field of Search ...................... 165/104.11, 104.15, 165/104.21, 104.22, 104.26, 104.33, 185, 80.3, 905, 907; 361/700, 703, 704; 257/714–715; 174/15.2

(56) References Cited

U.S. PATENT DOCUMENTS

| 4,461,343 | A | * | 7/1984 | Token et al. ............ 165/104.26 |
| 4,503,483 | A | * | 3/1985 | Basiulis .................... 361/700 |
| 4,770,238 | A | * | 9/1988 | Owen ..................... 165/104.26 |
| 4,785,875 | A | * | 11/1988 | Meijer et al. ........... 165/104.25 |
| 5,283,715 | A | * | 2/1994 | Carlsten et al. ............. 361/702 |
| 6,062,302 | A | * | 5/2000 | Davis et al. ............ 165/104.26 |
| 6,167,948 | B1 | * | 1/2001 | Thomas .................. 165/104.26 |
| 6,227,287 | B1 | * | 5/2001 | Tanaka et al. ............. 165/80.4 |
| 2004/0069455 | A1 | * | 4/2004 | Lindemuth et al. .... 165/104.15 |

FOREIGN PATENT DOCUMENTS

JP         2002318085 A   * 10/2002   ........... F28D/15/02

* cited by examiner

Primary Examiner—Tho v Duong
(74) Attorney, Agent, or Firm—Rosenberg, Klein & Lee

(57) ABSTRACT

A heat-pipe cooler includes a housing having no air contained therein, working liquid contained in the housing, a sinter metal held in the housing, and hollow cooling fins formed on the housing and communicating with interior space of the housing. Thus, heat produced by a heat source will be transferred to the sinter metal, and then the working liquid, which has been absorbed by the sinter metal, is evaporated by the heat, and travels into the cooling fins. And, the evaporated working liquid is cooled, and changes into liquid form in the cooling fins, drops onto, and is absorbed by the sinter metal. And finally, the working liquid flows back to the evaporating section of the cooler along the sinter metal with the help of capillary force.

3 Claims, 13 Drawing Sheets

STRUCTURE OF A HEAT-PIPE COOLER

BACKGROUND OF THE INVENTION

1. Field of the Invention

The present invention relates to a structure of a heat-pipe cooler, more particularly one, which is used for cooling chips of computers, and in which hollow cooling fins, fans are integrated with heat pipes, which have excellent capability of heat transfer and conduction, such that cooling efficiency is greatly increased.

2. Brief Description of the Prior Art

CPU (central processing unit), and GPU (graphic processing unit) are two major heat sources of a computer, and have to be cooled with efficient coolers otherwise they can malfunction. Referring to FIG. 1, a conventional cooler 5 for a computer chip includes a housing, several cooling fins 51 in the housing, and a fan 52 above the cooling fins 51, which housing is positioned on a chip 54 on a mother board 55 of a computer with heat conducting paste 53 being applied on a side thereof that touches the chip 54. Thus, heat produced by the chip 54 can travel to the cooling fins 51, from which it is dissipated by means of wind caused by the fan 52.

Because the speed of heat dissipation of a cooler largely depends on the total area of the cooling fins, manufacturers would make as many cooling fins over a limited area as possible in each CPU cooler. However, wind blowing from the fan will be very weak when it reach farther ends of the cooling fins, and in turns, the farther ends of the fins can't be rapidly cooled, and the cooler isn't efficient. Although large fans can be used instead to produce stronger wind for increasing the cooling efficiency, the cooler will become too large in size to suit laptop computers.

Referring to FIG. 15, a conventional heat pipe 7 includes a housing pipe 71, medium (working) liquid (not shown), and a member of capillary structure 72, which has better cooling capability than all of the metals found up to now, and is also called superconductor of heat; the medium liquid is poured into the housing pipe 71, and absorbed by the member of capillary structure 72 after air has been made to leave inside of the pipe 71; the housing pipe 71 is sealed after the medium liquid is poured into it. The housing pipe 71 includes a cooling section, and an evaporating section; when medium liquid in the evaporating section of the pipe 71 is evaporated with heat, it will flow to the cooling section of the pipe 71 such that heat is released, and it changes into liquid, and is absorbed by the member of capillary structure 72, which liquid will flow back to the evaporating section immediately with the help of capillary force. Therefore, heat can be efficiently dissipated by means of the heat pipe 7.

Heat pipes with the above structure are widely used in coolers for computer chips. Referring to FIG. 16, a cooler 6 includes several cooling fins 61, a heat pipe 62 connected with the cooling fins 61, a metal plate 63 connected to one end of the heat pipe 62, and a fan 67 next to the cooling fins 61. The metal plate 63 is positioned on a chip 65 on a mother board 66 of a computer with heat conducting paste 64 being applied on a side thereof that touches the chip 65. Thus, heat produced by the chip 65 can travel to the cooling fins 61, from which it is dissipated by means of wind caused by the fan 67.

Although the heat pipe has excellent capability of heat transfer, it still has to be used together with fans and cooling fins to dissipate heat efficiently. As mentioned in the above, cooling capability of conventional cooling fins isn't good enough, and in turns, efficiency of the whole cooler is reduced. Furthermore, because heat pipes, metal plates, and cooling fins of conventional coolers are connected together by means of welding, there will be more resistance to heat transfer, and the cooling efficiency is reduced.

SUMMARY

It is a main object of the present invention to provide a heat-pipe cooler to overcome the above disadvantages.

The heat-pipe cooler of the present invention includes a housing having no air contained therein, working liquid contained in the housing, a sinter metal held in the housing, and hollow cooling fins formed on the housing and communicating with interior space of the housing. Thus, heat produced by a heat source will be first transferred to the sinter metal, and then the working liquid, which has been absorbed by the sinter metal, is evaporated by the heat, and travels into the cooling fins wherein it is cooled to change back into liquid. Because the cooler has no air contained therein, all portions of the cooling fins will reach the same temperature relatively rapidly, and the cooler has increased efficiency.

BRIEF DESCRIPTION OF THE DRAWINGS

The present invention will be better understood by referring to the accompanying drawings, wherein.

DETAILED DESCRIPTION OF THE PREFERRED EMBODIMENTS

Figure 1:
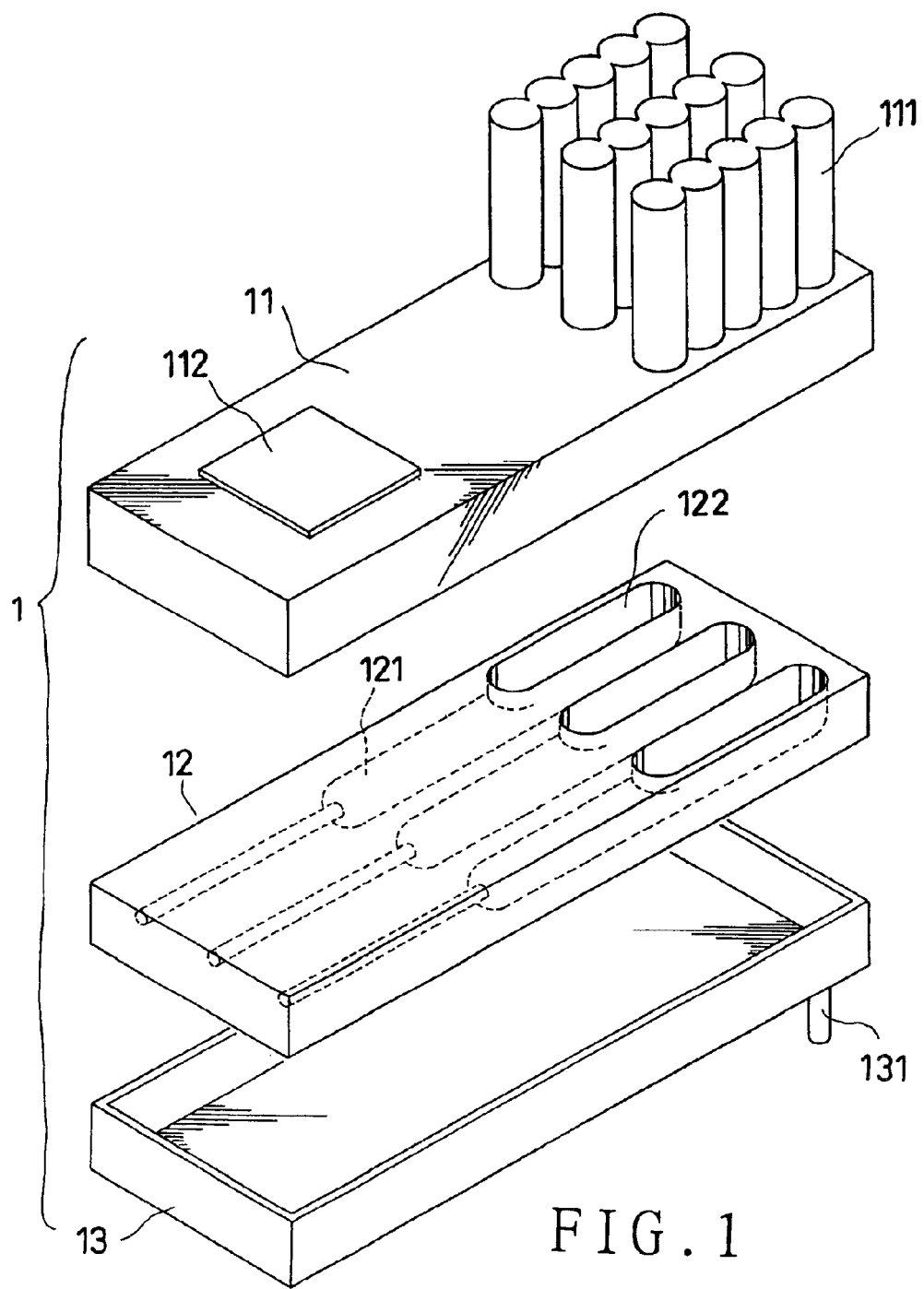
FIG. 1 is an exploded perspective view of a cooler according to the present invention.
Figure 2:
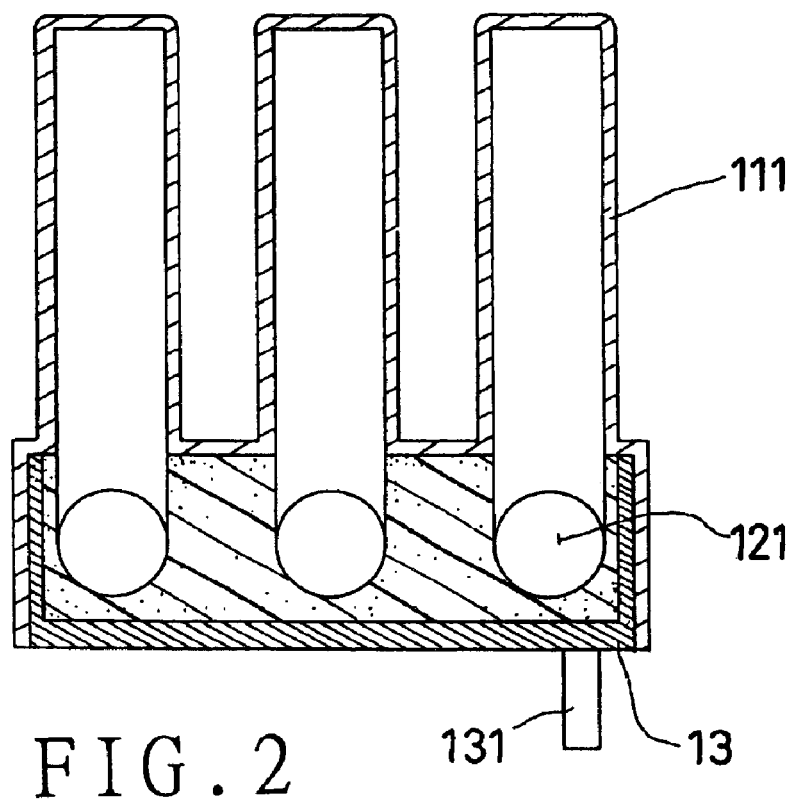
FIG. 2 is a cross-sectional view of an embodiment of a cooler (1)

Referring to FIGS. 1 and 2, a first embodiment 1 of a cooler of the present invention includes an upper cover 11, a sinter metal 12, and a bottom cover 13.

The upper cover 11 has several cooling fins 111 spaced apart on an upper side thereof, which have corrugated shape on two lateral sides, and are hollow, and made by means of deep drawing manufacturing technology. And, a metal plate 112 with high coefficient of heat transfer, which is used to touch a chip of a computer for conducting heat as well as reducing resistance to heat transfer, is secured on an evaporating section of the upper cover 11 by means of welding; the larger the heat dissipation area of the computer chip is, the thinner the metal plate 112 should be, and if the heat dissipation area of the computer chip is large enough, the metal plate 112 won't be needed.

The sinter metal 12 is made of power metal by means of sintering process, and has tiny apertures all over the inside thereof, a heated section, a cooling section, and several passages 121 therein; each of the passages 121 includes a thinner section corresponding to the heated section, and a thicker section corresponding to the cooling section such that resistance to heat transfer is reduced, and such that there is pressure difference for evaporated working fluid to flow to the cooling section of the sinter metal 12. In addition, the sinter metal 12 has openings 122 on the cooling section thereof, which communicate with the passages 121 respectively.

The bottom cover 13 is connected with the upper cover 11 such that both form a housing for containing the sinter metal 12 therein. The bottom cover 13 has a metal pipe 131 connected thereto, through which air will travel while the housing is being made to have no air therein, and through which working liquid is made to flow into the housing consisting both the upper cover 11 and the bottom cover 13. Furthermore, the bottom cover 13 can be formed with a corrugated shape on a bottom portion thereof such that it has increased strength, and additional passages are provided for allowing evaporated working liquid to travel through, as shown in FIG. 3.

In assembling the present cooler 1, the sinter metal 12 is secured to the evaporating section of the upper cover 11 by means of solders having relatively high coefficient of heat transfer, and the bottom cover 13 and the upper cover 11 are securely joined together by means of welding such that the sinter metal 12 is held in the room formed by both the covers 11 and 13. Next, all air is drawn out of the room through the metal pipe 131, and working liquid is injected into the room through the metal pipe 131; the surfaces of the cooling fins 111 will be corrugated because all air is drawn out of the room formed by both the covers 11 and 13. And finally, the metal pipe 131 is sealed.

The present cooler is positioned with the metal plate 112 touching a computer chip. Thus, when the computer is working, heat produced by the chip will be transferred to the heated section of the sinter metal 12, i.e. the left section of the sinter metal 12 in FIG. 1, and then working liquid absorbed by the sinter metal 12 is evaporated by the heat, and travels into the cooling fins 111 via the passages 121 and the openings 122 such that the cooling fins 111 become hot. And, wind blows from fans (not shown) to cool the cooling fins 111, and the evaporated working liquid changes into liquid form, and is absorbed by the sinter metal 12. Finally, the working liquid in liquid form flows back to the heated section of the sinter metal 12 with the help of capillary force. Therefore, heat from the chip can be dissipated at increased speed.

Figure 3:
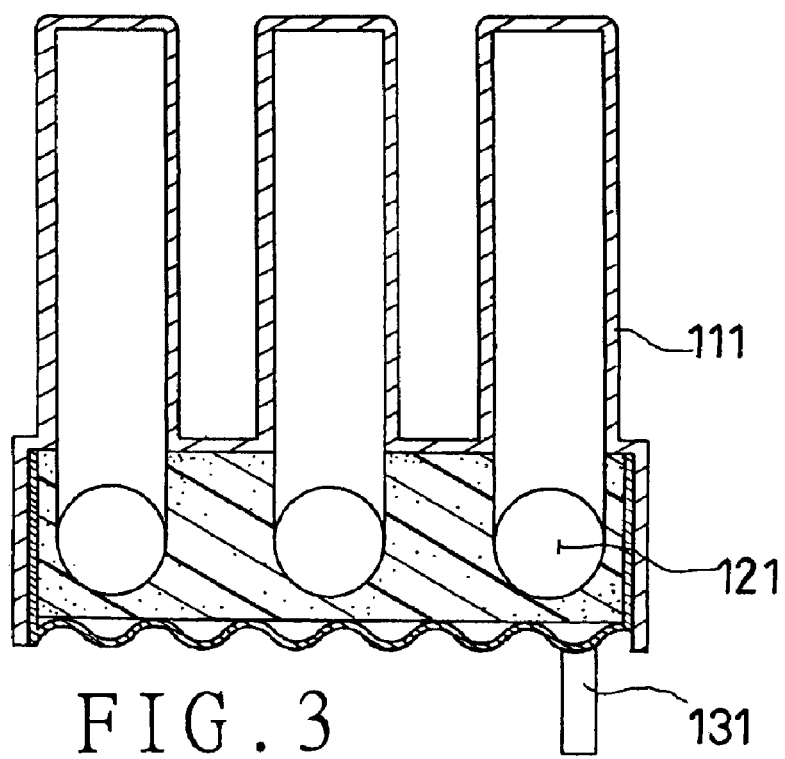
FIG. 3 is a cross-sectional view of an embodiment of a cooler (2)

Furthermore, referring to FIG. 3, the bottom cover 13 is formed with a corrugated shape on a bottom portion thereof such that elongated passages are formed between the sinter metal 12 and the bottom cover 13, and evaporated working liquid can travel at increased speed.

Figure 4:
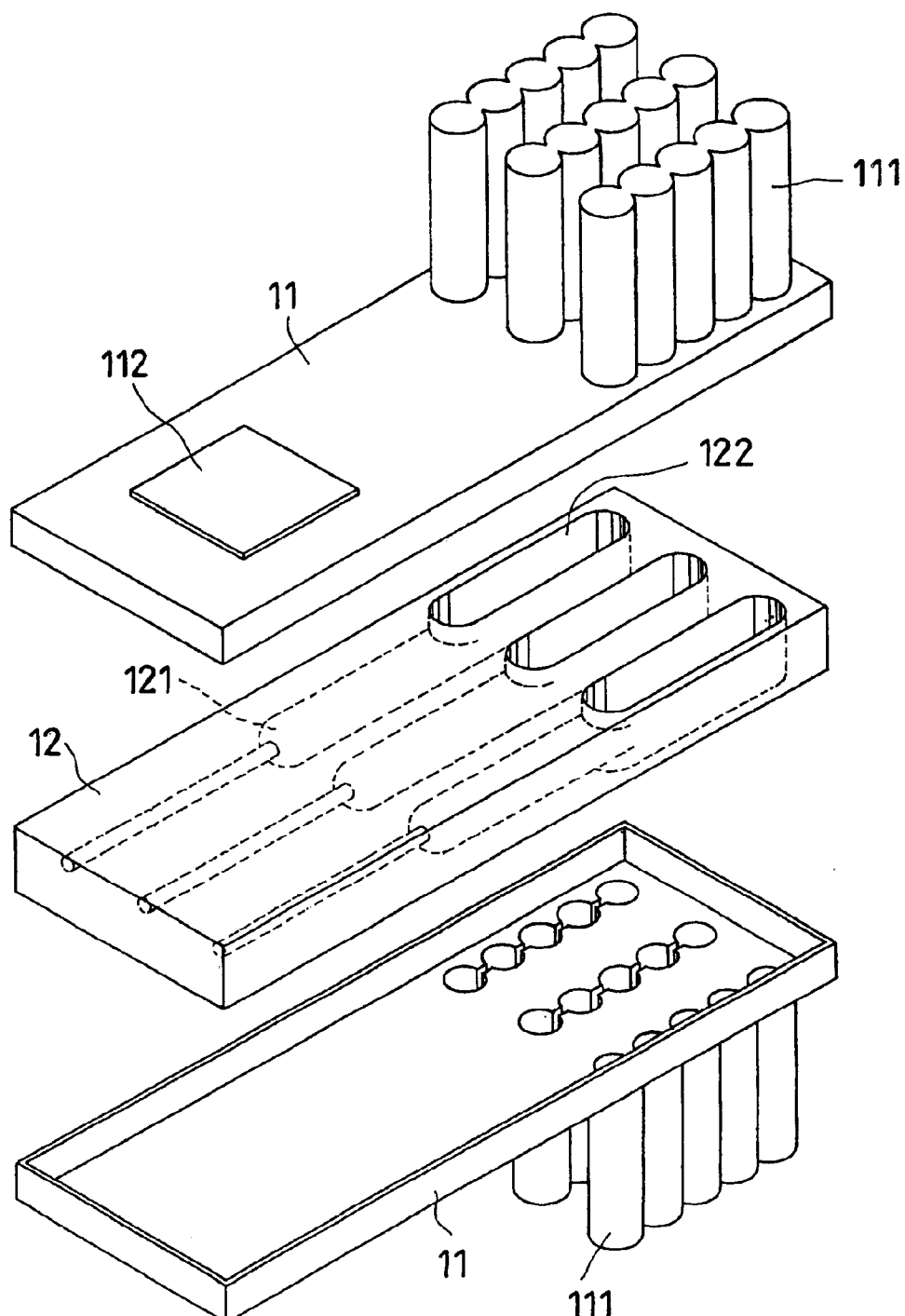
FIG. 4 is an exploded perspective view of an embodiment of a cooler in the present invention (1)

Referring to FIG. 4, in a second embodiment, another cover 11, which has the same shape as the above upper cover 11, is used instead of the bottom cover 13; thus, the cooler has cooling fins 111 on both upper and lower sides thereof, which will provide a heat dissipation area two times that of the cooling fins 111 of the first embodiment, and in turns, efficiency of the cooler is increased. The cooler is larger in size therefore it suitable for use in desktop computers, and large computers. And, the cooler has to be used in an upright position such that after working liquid changes into liquid form in the cooling fins 111, it can flow back to the sinter metal 12, and to the heated section owing to gravity.

Figure 5:
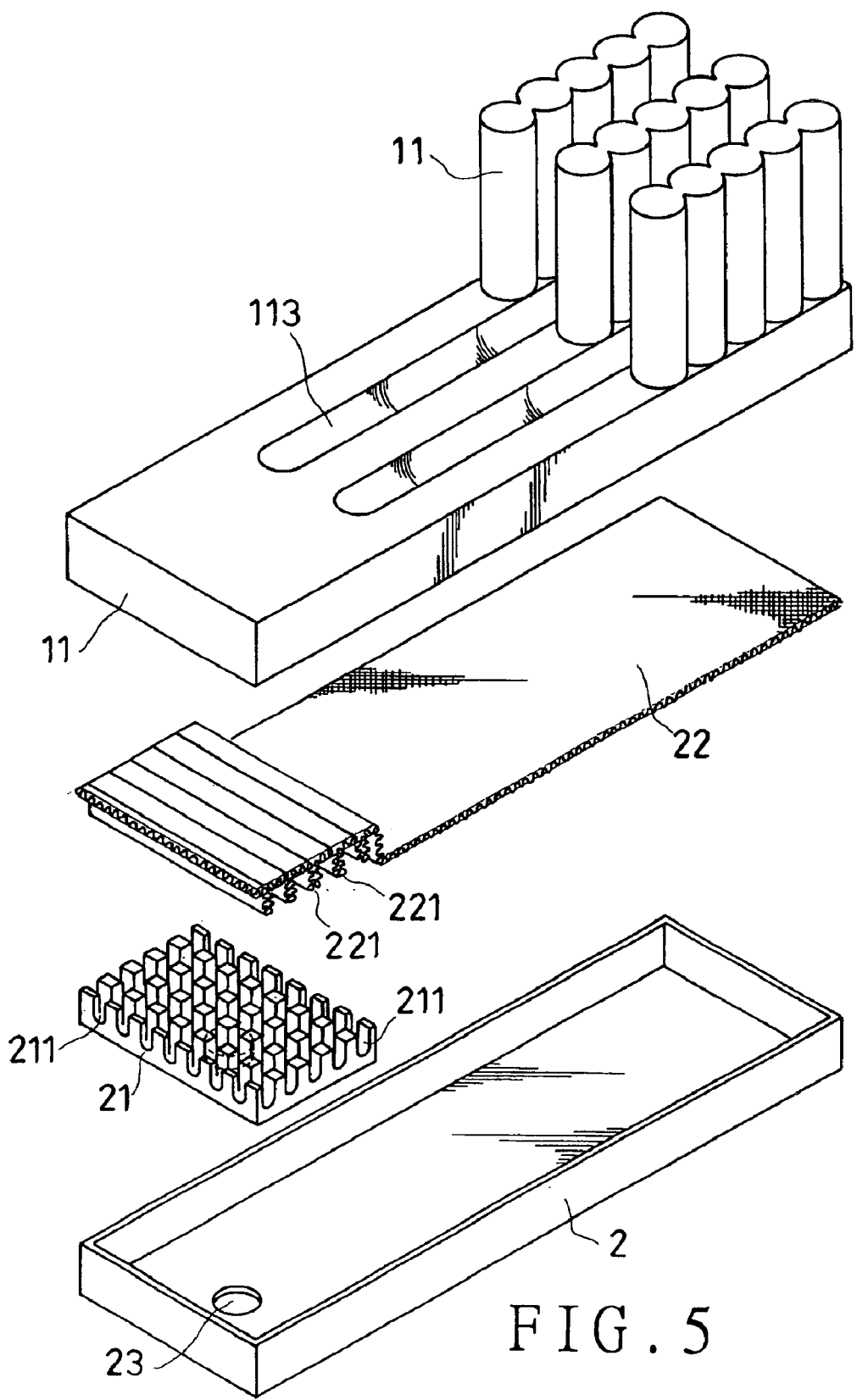
FIG. 5 is an exploded perspective view of an embodiment of a cooler in the present invention (2)
Figure 6:
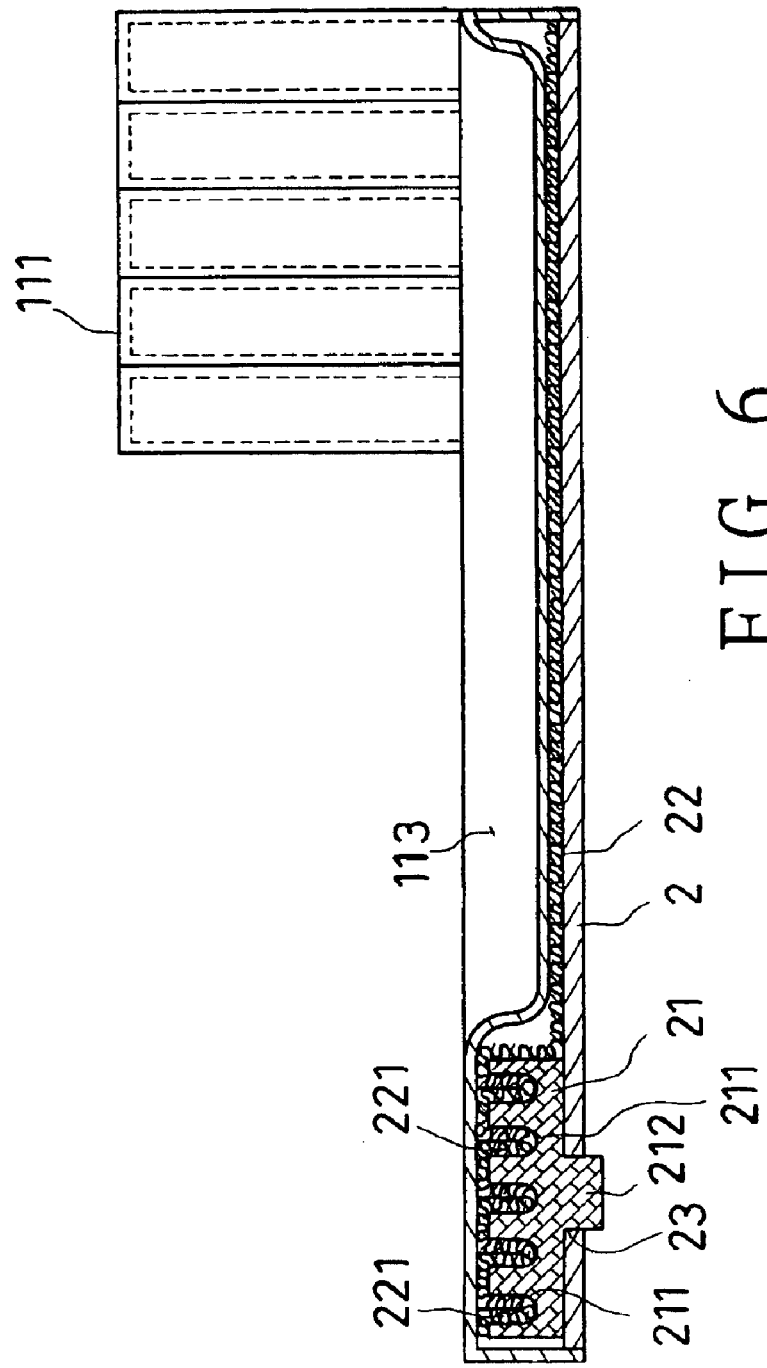
FIG. 6 is a cross-sectional view of an embodiment of a cooler (3)

Referring to FIGS. 5 and 6, the upper cover 11 is formed with several curved concavities 113 on the upper portion such that the upper portion is prevented from sinking when all air is forced to travel outside the room, in which the sinter metal 12 is held.

Referring to FIGS. 5 and 6 again, a third embodiment of a cooler includes upper cover 11, a bottom cover 2, a heated member 21, and a member with capillary structure 22; the covers 11 and 2 are joined together such that a room is formed, in which both the heated member 21 and the member with capillary structure 22 are held; the bottom cover 2 has a through hole 23 on a lower portion. The heated member 21 is securely joined to the bottom cover 2 by means of welding, and has trenches 211 in two different directions, which are substantially perpendicular to each other, on an upper side thereof while the member with capillary structure 22 is folded so as to have several fitting portions 221 on a lower side of one end thereof, which fitting portions 221 are respectively held in those of the trenches 211 of the heated member 21 that are in a first direction such that the area of touching portions between the heated member 21 and the member with capillary structure 2 is increased, and the speed of heat transfer will increase accordingly, and such that steam can pass through trenches 211 of the other direction. Materials for the member with capillary structure 2 can be glass fiber cloth, several metal nets, which are stuck together, or ceramic cotton. Furthermore, the heated member 21 has a heat conducting portion 212 projecting down from a lower side thereof, which is passed through the through hole 23 of the bottom cover 2 for contact with a computer chip. Similar to the earlier embodiments, all air is drawn out of the room formed by the covers 11 and 2, and the room is sealed after working liquid is injected therein. Thus, when the computer is working, heat produced by the chip will be first transferred to the heated member 21 via the heat conducting portion 212. Including the upper cover 11, and the member with capillary structure 2, the cooling cycle performed by the present embodiment is the same as those of the earlier embodiments therefore it won't be described again herein.

Figure 7:
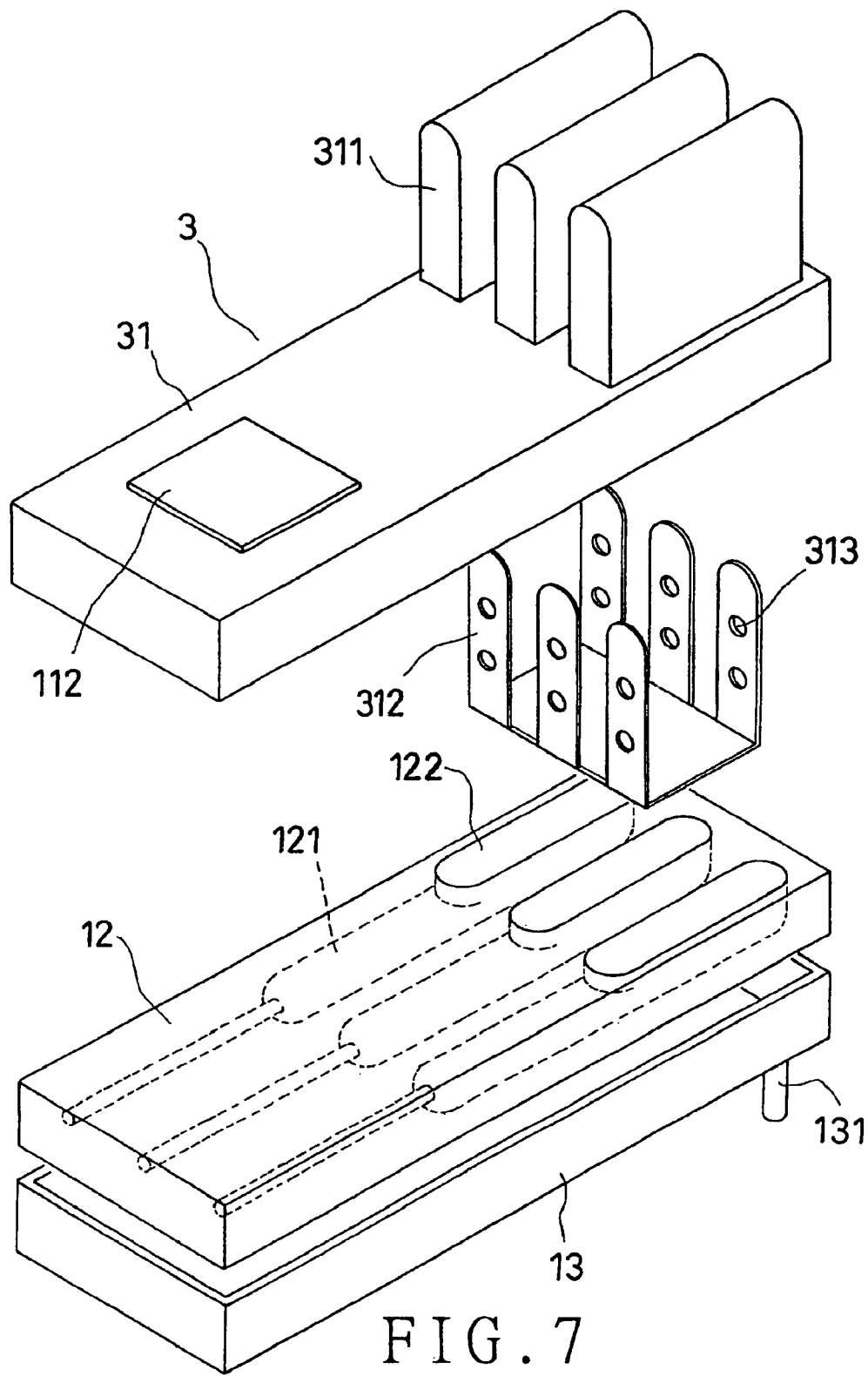
FIG. 7 is an exploded perspective view of an embodiment (3)

Referring to FIG. 7, a fourth embodiment of a cooler, which is substantially the same as the first embodiment (FIGS. 1 and 2), including sinter metal 12, and bottom cover 13, is provided with an upper cover 3 instead of upper cover 11, which upper cover 3 has several cooling fins 311 on an upper side thereof, and a support member, which is held in the room formed by both the upper cover 3 and the bottom cover 13, and which has several supporting plates 312 passed into the cooling fins 311. In addition, the supporting plates 312 have several through holes 313 formed thereon. With the supporting plates 312 contacting inner sides of the cooling fins 311, the cooling fins 311 won't be forced to change shape by the pressure of atmosphere when all air is drawn out of the room formed by both the upper cover 3 and the bottom cover 13. And, evaporated working liquid still can travel all over the interior space of the cooling fins 311 because of the through holes 313.

Figure 8:
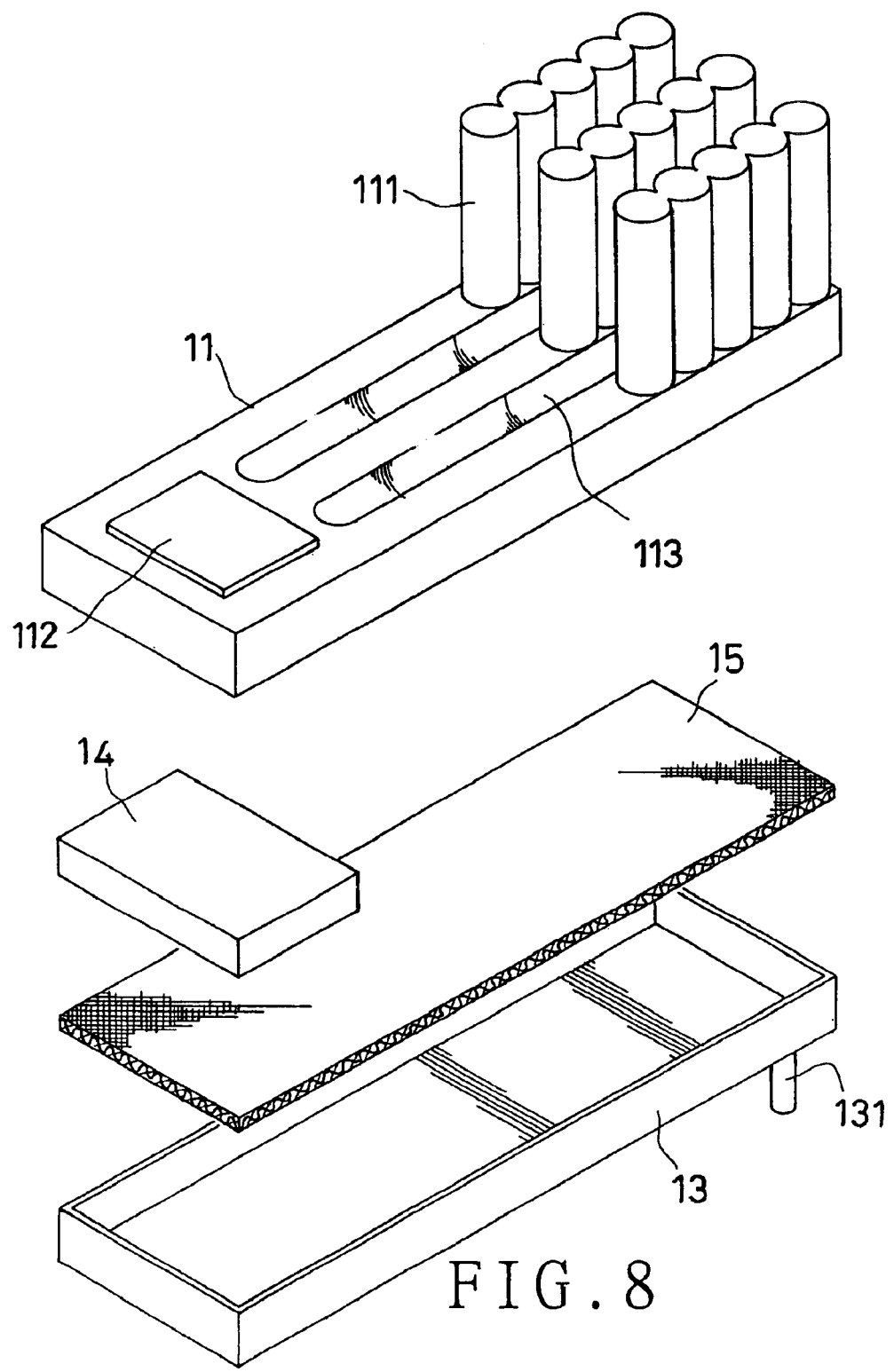
FIG. 8 is an exploded perspective view of an embodiment (4)
Figure 9:
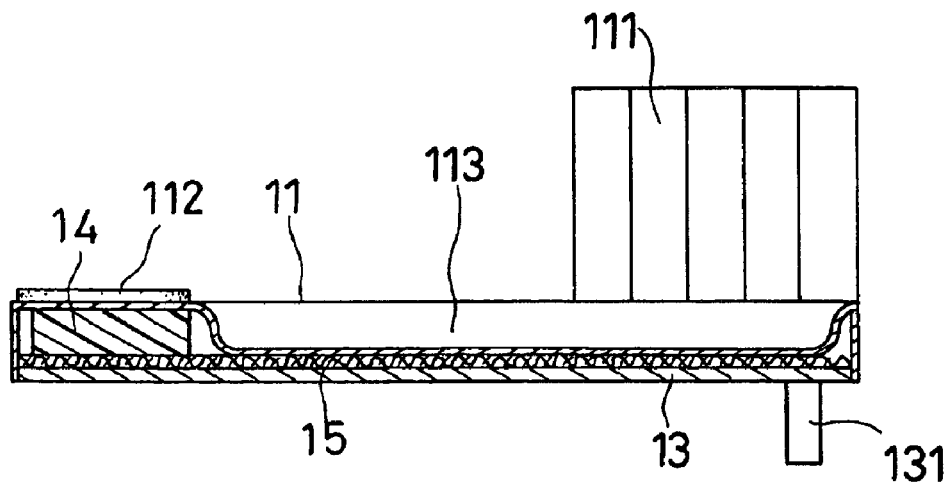
FIG. 9 is a cross-sectional view of an embodiment of a cooler (4)
Figure 15:
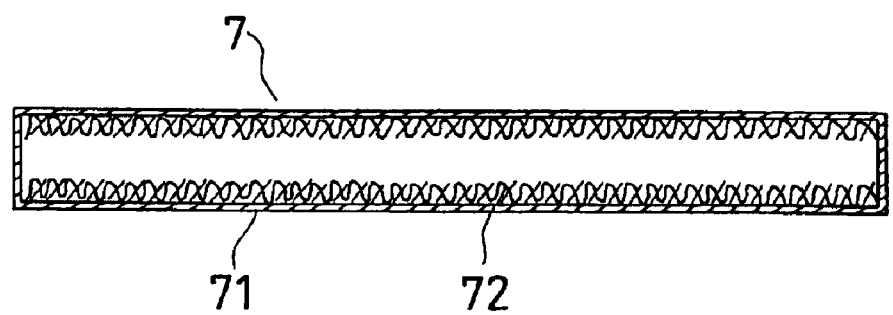
FIG. 15 is a cross-sectional view of the conventional heat pipe.

Because sinter metal is relatively expensive, the inventor of the present invention offers a solution to the problem with high cost of sinter metal. Referring to FIG. 8, a fifth embodiment of a cooler is provided, which includes an upper cover 11 the same as that of the third embodiment (FIG. 5), a sinter metal 14, a member with capillary structure 2, and a bottom cover 13 the same as that of the first embodiment (FIG. 1); the covers 11 and 13 is joined together to form a room, in which both the sinter metal 14 and the member with capillary structure 15 are held; the sinter metal 14 is formed with such a small size as to only touch the evaporating section of the upper cover 11; the member with capillary structure 15 is positioned over the up facing portion of an inner side of the bottom cover 13, and the materials for the member with capillary structure 15 can be glass fiber cloth, several metal nets, which are stuck together, or ceramic cotton. Furthermore, the upper cover 11 is formed with several curved concavities 113 on the upper portion such that the upper portion is prevented from sinking when all air is drawn out of the room formed by the covers 11 and 13. And, the same as the above embodiments, the present cooler has working liquid contained in the room. Thus, when the computer is working, heat produced by the chip will be transferred to the sinter metal 14, and then working liquid is evaporated by the heat, and travels into the cooling fins 111 such that the cooling fins 111 become hot. And, wind blows from fans to cool the cooling fins 111, and the evaporated working liquid changes into liquid form, and drops back onto the member with capillary structure 15. Finally, the working liquid flows back to the sinter metal 14 with the help of capillary force.

Figure 10:
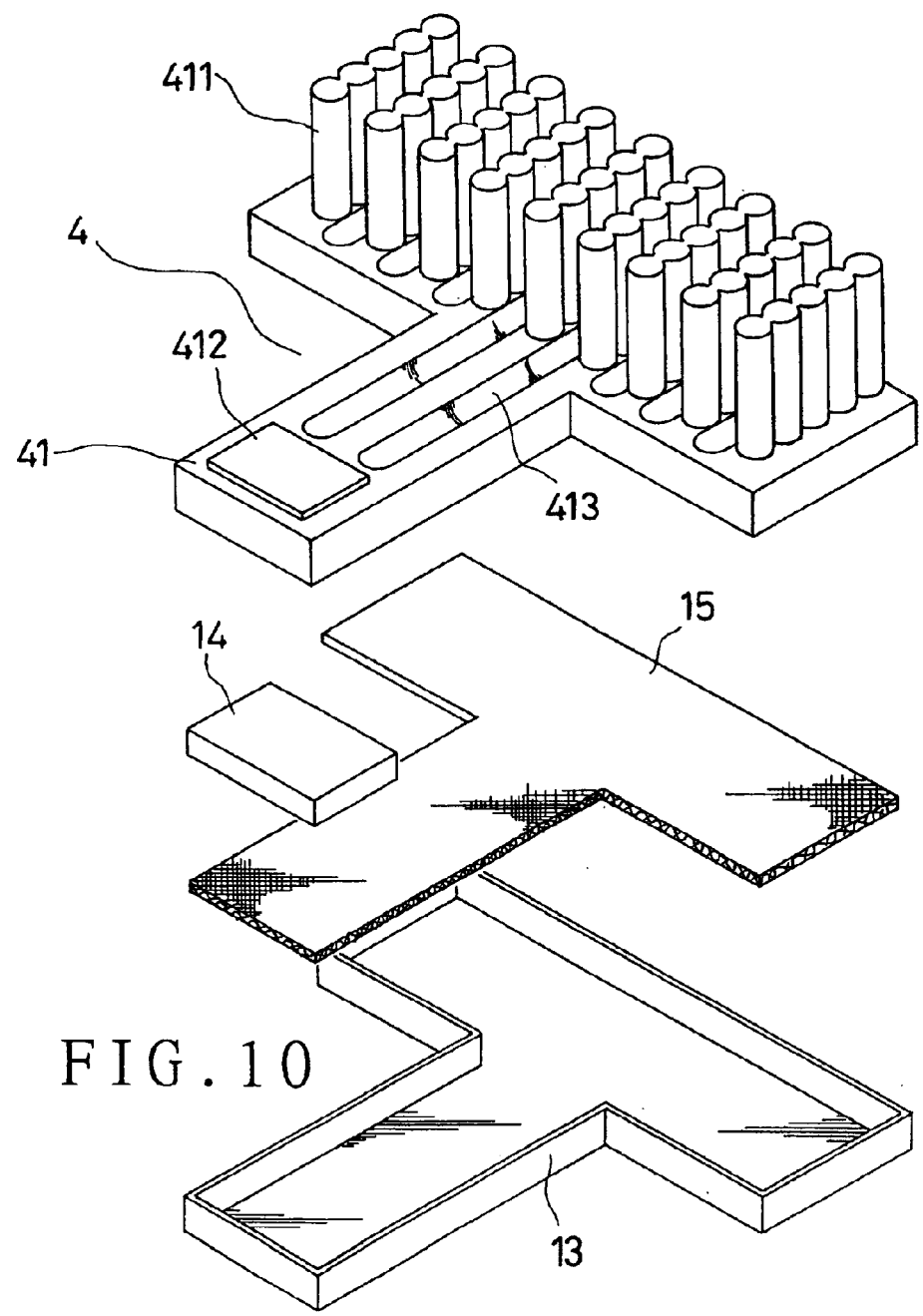
FIG. 10 is an exploded perspective view of an embodiment (5)

Referring to FIG. 10, a sixth embodiment in the present invention is substantially the same as the fifth one (FIG. 8), but it has more cooling fins such that larger heat dissipation area is provided for suiting large computers, and desktop computers. The present embodiment includes an upper cover 4, a metal plate 412 secured on an upper portion 41 of the upper cover 4, a sinter metal 14, a member with capillary structure 15, and a bottom cover 13 joined to the upper cover 4; the sinter metal 14 and the member with capillary structure 15 are held in the room formed by the covers 4 and 13; a cooling section of the upper cover 4 is formed with such a shape as to allow more cooling fins 411 to be formed thereon, and curved concavities 413 are formed all over the upper portion 41 such that the upper portion 41 is prevented from sinking when all air is drawn out of the room; the member with capillary structure 15 is shaped so as to fit in the upper cover 4.

Figure 11:
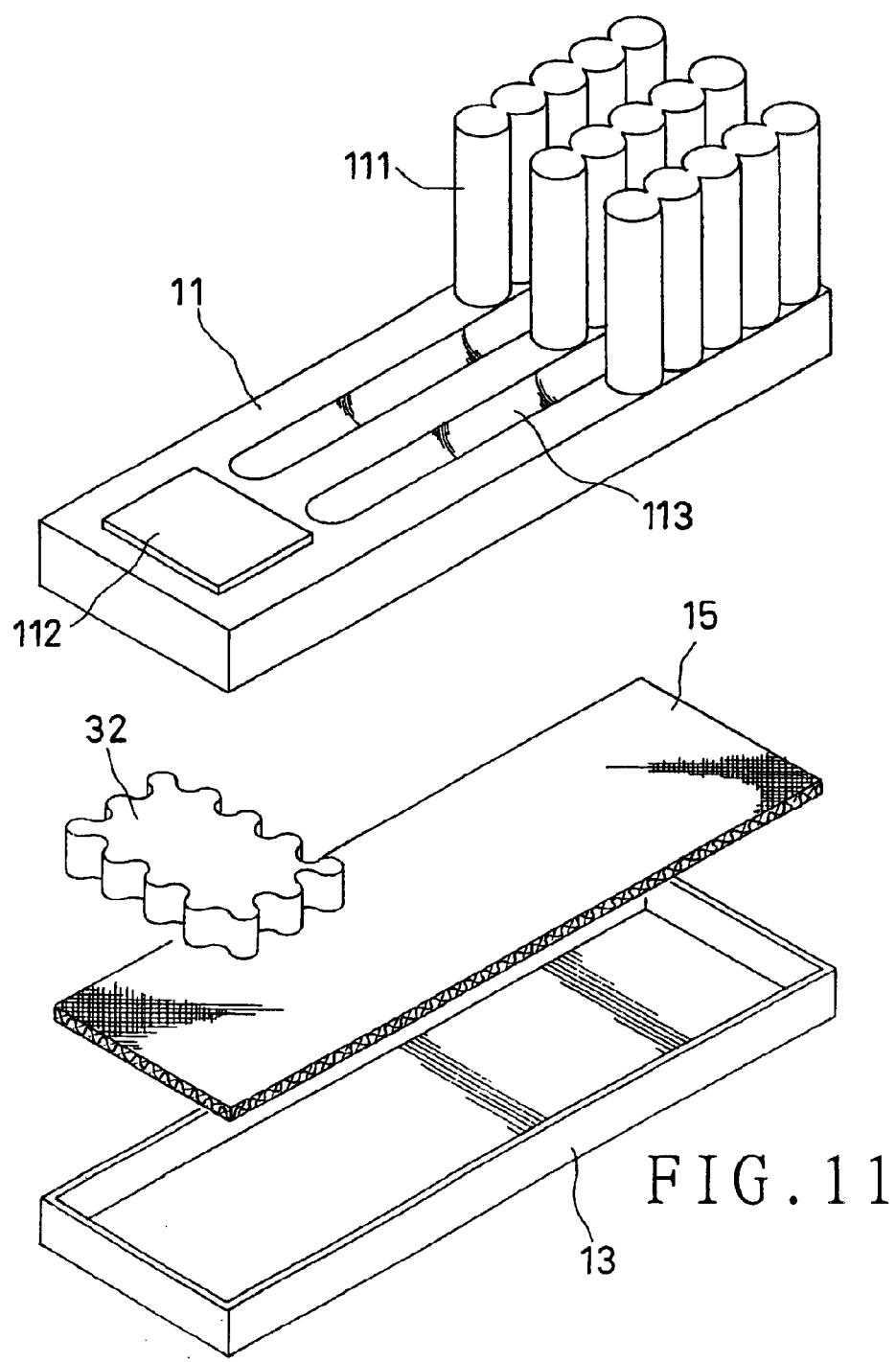
FIG. 11 is an exploded perspective view of an embodiment (6)

Referring to FIG. 11, a sinter metal 32 with corrugated edges is used instead of the rectangular one 14 such that cost of sinter metal material is reduced, and larger area of heat transfer is provided, allowing the working liquid to be evaporated at increased speed. Consequently, heat from the computer chip can be dissipated more rapidly.

Figure 12:
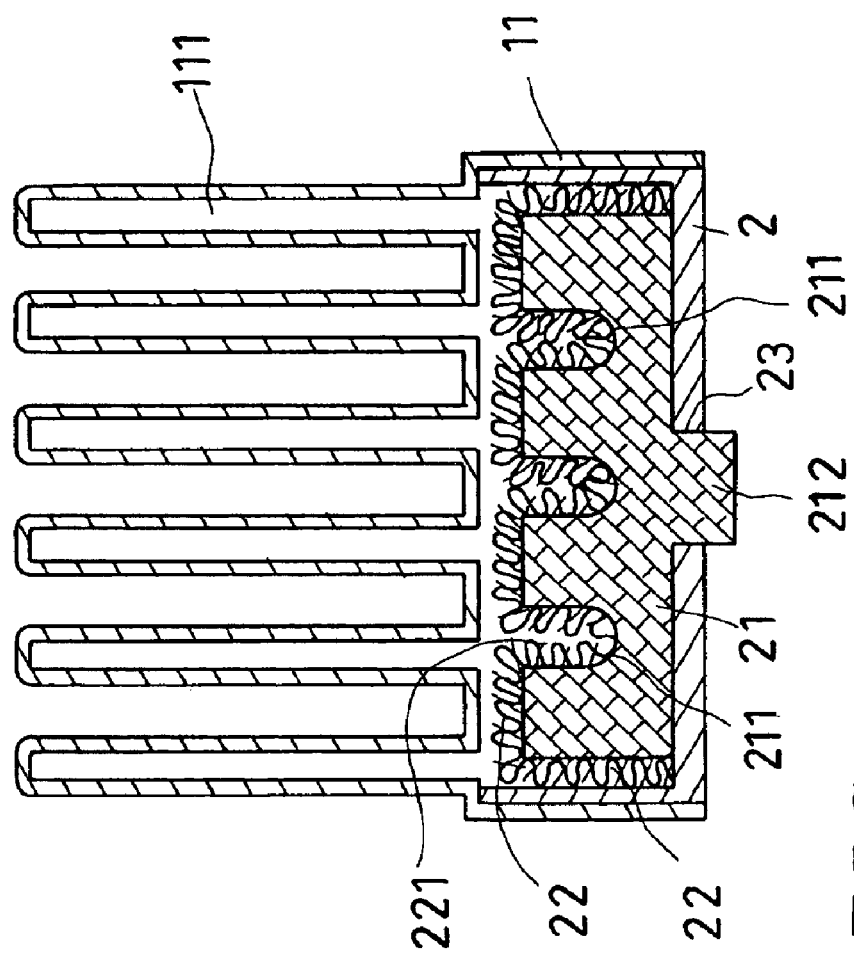
FIG. 12 is a cross-sectional view of an embodiment of a cooler (5)

Referring to FIG. 12, a cooler suitable for use with desktop computers is provided, which includes upper cover 11, a bottom cover 2, a heated member 21, and a member with capillary structure 22, which are formed with such a size as to fit the computer chips; the covers 11 and 2 are joined together to form a room, in which both the heated member 21 and the member with capillary structure 22 are held; the bottom cover 2 has a through hole 23 on a lower portion. The heated member 21 has trenches 211 on an upper side thereof. And, the member with capillary structure 22 is folded so as to have several fitting portions 221 on a lower side of one end thereof, which are respectively fitted in the trenches 211. Furthermore, the heated member 21 has a heat conducting portion 212 passed through the through hole 23 of the bottom cover 2 and secured to the bottom cover 2 by means of welding. The heat conducting portion 212 will touch a chip when the present cooler is fitted to a computer; thus, heat from the chip can be rapidly transferred to the present cooler.

Figure 13:
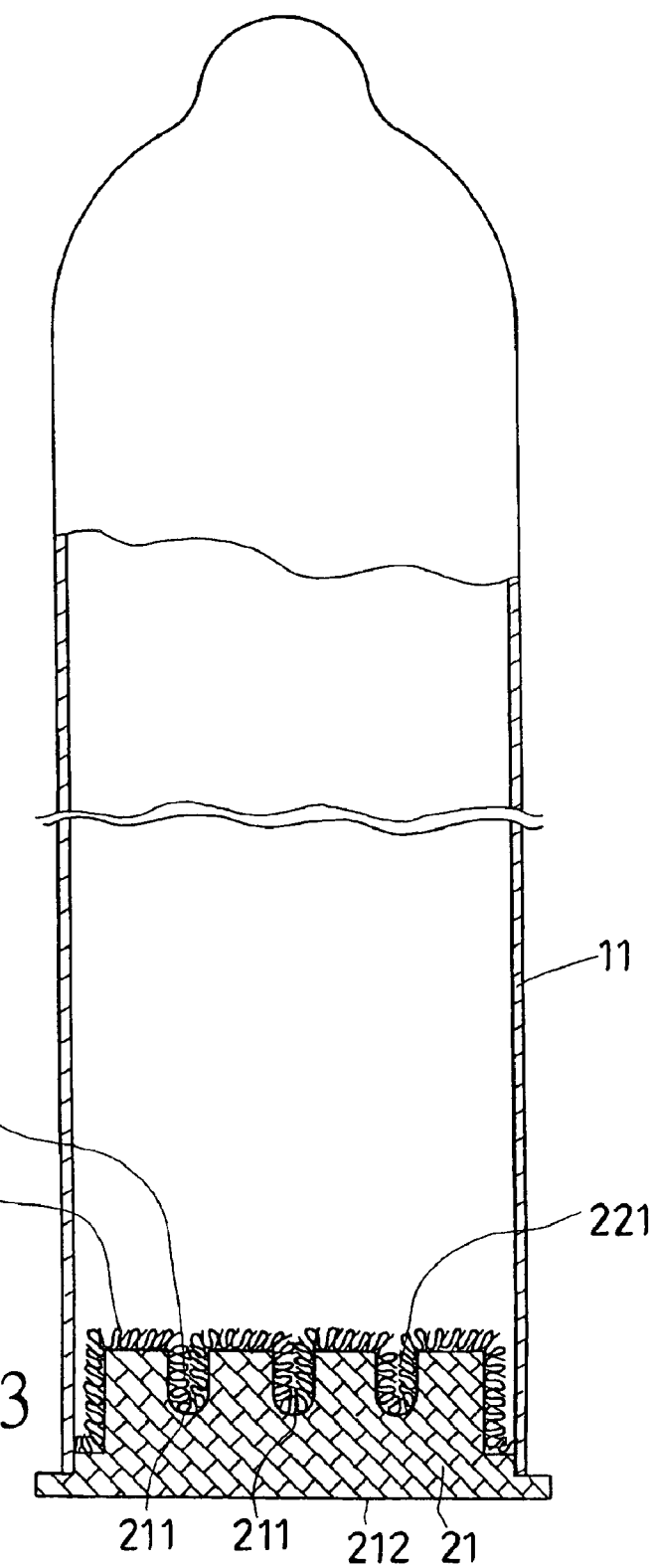
FIG. 13 is a cross-sectional view of an embodiment of a cooler (6)
Figure 14:
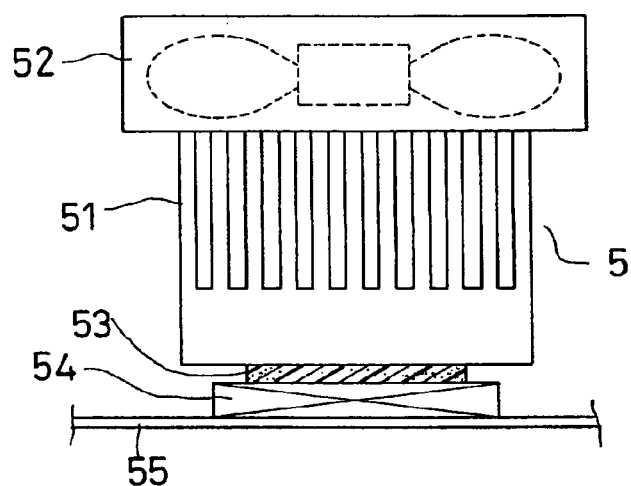
FIG. 14 is a cross-sectional view of the first conventional cooler.
Figure 16:
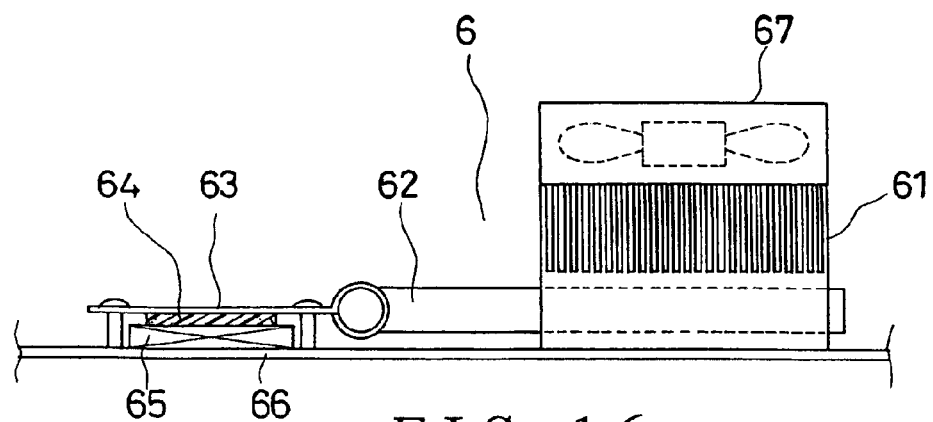
FIG. 16 is a cross-sectional view of the second conventional cooler.

Referring to FIG. 13, upper cover 11 is formed in the shape of a hollow tube, and has a hole (not shown) at one end thereof for allowing air to be drawn out of the present cooler through it, which hole will be sealed after all air is drawn out of the cooler. The tube-shaped upper cover 11 is pressed against an edge of a heated member 21 at an open end, and securely joined to the heated member 21. And, the heated member 21 is joined to a member with capillary structure 22 with fitting portions 221 of the member 22 being respectively fitted in the trenches 211 thereof.

From the above description, it can be easily understood that the coolers of the present invention have advantages as followings:

1. Because all air has been drawn out of the inner space of the coolers, all portions of the cooling fins will reach the same temperature relatively rapidly. Therefore, the present coolers are more efficient as compared with the conventional cooling fins whose lower ends can't be effectively cooled by wind blowing from the fans.

2. There is no power consumption because the present coolers are in the form of heat pipes. And, the present coolers don't have to be used together with large, noisy, power-consuming electric fans to be efficient.

What is claimed is:

1. A heat-pipe cooler, comprising
   an upper cover having a plurality of hollow cooling fins spaced apart thereon; the cooling fins having corrugated shape on two lateral sides thereof;
   a bottom cover; the upper and the bottom covers being connected together to form a sealed room, in which there in no air;
   working liquid contained in the room; and
   a sinter metal held in the room; the sinter metal including a heated section, and a cooling section; the sinter metal having a plurality of passages therein; each of the passages including a thinner section corresponding to the heated section; the sinter metal having openings on the cooling section, which communicate with the passages, and the cooling fins of the upper cover.

2. The heat-pipe cooler as claimed in claim 1, wherein the bottom cover is formed with a corrugated shape.

3. The heat-pipe cooler as claimed in claim 1, wherein the bottom cover has a same shape as the upper cover, having a plurality of hollow cooling fins with corrugated lateral sides spaced apart thereon.

* * * * *